US007332982B2

(12) United States Patent
Yun et al.

(10) Patent No.: US 7,332,982 B2

(45) Date of Patent: Feb. 19, 2008

(54) WAVEGUIDE DIPLEXER OF ELECTRIC PLANE T-JUNCTION STRUCTURE WITH RESONANT IRIS

(75) Inventors: So-hyeun Yun, Daejon (KR); Man-Seok Uhm, Daejon (KR); In-Bok Yom, Daejon (KR); Jong-Heung Park, Daejon (KR)

(73) Assignee: Electronics and Telecommunications Research Institute (KR)

( * ) Notice: Subject to any disclaimer, the term of this patent is extended or adjusted under 35 U.S.C. 154(b) by 93 days.

(21) Appl. No.: 11/028,256

(22) Filed: Dec. 30, 2004

(65) Prior Publication Data

US 2006/0028296 A1 Feb. 9, 2006

(30) Foreign Application Priority Data

Aug. 3, 2004 (KR) ...................... 10-2004-0061243

(51) Int. Cl.
*H01P 5/12* (2006.01)
*H03H 7/38* (2006.01)
*H03H 7/46* (2006.01)

(52) U.S. Cl. ...................... 333/126; 333/129; 333/132; 333/135

(58) Field of Classification Search ................ 333/126, 333/129, 132, 135
See application file for complete search history.

(56) References Cited

U.S. PATENT DOCUMENTS 3,587,008 A * 6/1971 Tsuda ......................... 333/212

(Continued)

FOREIGN PATENT DOCUMENTS

JP 2003283212 * 10/2003

(Continued)

OTHER PUBLICATIONS

"Ellimination of Fine Tuning in High Power, Low-PIM Dplexers for Combined Transmit/Receive Antennas", Microwave Filters and Multiplexer, IEE Colloquim), pp. 4/1-4/6, 1990.

(Continued)

*Primary Examiner*—Robert Pascal
*Assistant Examiner*—Kimberly E Glenn
(74) *Attorney, Agent, or Firm*—Blakely, Sokoloff, Taylor & Zafman

(57) ABSTRACT

A waveguide diplexer having an electric plane T-junction structure with a resonant iris is disclosed. The waveguide includes: a waveguide having a predetermined shaped cross section; a transmitting filter for preventing to generate a harmonic band and a higher mode in a receiving band by changing impedance to have a low pass characteristic inside the waveguide; a receiving filter for minimizing an insertion loss by changing impedance to have a bandpass characteristic inside the waveguide; an electric plane T-junction for isolating/combining a transmitting signal and a receiving signal without electric interference by connecting the transmitting filter and the receiving filter, and minimizing interference of a frequency transmitted/received through the transmitting filter and the receiving filter; and an impedance converter for differentiating a transmitting port and a receiving port with minimum electric interference to the transmitting filter and the receiving filter by changing the impedance.

7 Claims, 7 Drawing Sheets

U.S. PATENT DOCUMENTS

| | | | | |
|---|---|---|---|---|
| 3,597,710 | A * | 8/1971 | Levy | 333/210 |
| 4,673,903 | A * | 6/1987 | Saad | 333/210 |
| 4,920,351 | A * | 4/1990 | Bartlett et al. | 343/756 |
| 4,978,934 | A * | 12/1990 | Saad | 333/241 |
| 6,366,564 | B1 * | 4/2002 | Hiraka et al. | 370/275 |
| 7,019,706 | B2 * | 3/2006 | Yoneda et al. | 343/772 |

FOREIGN PATENT DOCUMENTS

| | | |
|---|---|---|
| KR | 1996-0014401 | 10/1996 |

OTHER PUBLICATIONS

"Ka Band WAveguide Diplexer using E-plane T-junction with inductive iris"(APMC-2002, vol. 1, pp. 508-511, 2002.

"A Study on the Design and Fabrication of Diplexer Using H-pland T-junction for KOREASAT-III Transponder", Korea Electromagnetic Engineering Society, vol. 19, No. 4, pp. 582-593, Aug. 1999.

* cited by examiner

WAVEGUIDE DIPLEXER OF ELECTRIC PLANE T-JUNCTION STRUCTURE WITH RESONANT IRIS

FIELD OF THE INVENTION

The present invention relates to a waveguide structure for a satellite; and, more particularly, to a waveguide diplexer having an electric plane junction structure with a resonant iris for transferring a signal in high electric power through a transmitting path, transferring a signal with low insertion loss through a receiving path, and preventing a transmitting power to interfere to a receiver by connecting a transmitting filter and a receiving filter with an electric plane junction providing good isolation characteristics between a transmitter and a receiver.

DESCRIPTION OF THE PRIOR ART

Generally, a waveguide diplexer is equipped at back of feeding horn in a satellite antenna feeder and isolates a transmitting signal and a receiving signal. For isolating, a waveguide diplexer having a T-junction form or a divider form is commonly used.

The T-junction is classified to an electric plane junction and a magnetic plane junction. By using the T-junction, a physical signal path is decided. The T-junction is designed to have one path for transmitting or receiving signals and the other path as a short circuit.

Conventionally, the magnetic plane junction is commonly used as the T-junction for minimizing interference of frequency transmitted/received through a transmitting filter and a receiving filter.

There have been various conventional diplexer introduced such as a diplexer using a symmetric inductive iris filter, a diplexer using an asymmetric inductive iris and a poster, a diplexer having a parallel stub structure, and a diplexer having a corrugated structure.

The transmitting/receiving filter is classified to a maximum butterworth response, a Chebyshev response, an elliptic function response and a linear phase response according to response characteristics. If the minimum insertion loss is a major factor for designing a filter, the maximum butterworth response is used. The Chebyshev response commonly is used for satisfying sharp cutoff characteristics. If an attenuation ratio is not a factor for designing a filter, the linear phase response filter is used for providing superior phase response. Meanwhile, a performance of the filter can be improved by raising an order of the filter for all cases. However, increase of filter's order may cause a breakdown when high power signal is passed through the filter because narrow gap of a waveguide in the filter. By increasing the order of the filter, a gap of the waveguide in the filter becomes narrower and when the high power signal is passed through the narrow gap of the waveguide, the breakdown may be caused. Therefore, raising the order of filter is not appropriate method for improving the performance of the filter.

As mentioned above, the magnetic plane T-junction is used for isolating the transmitting path and the receiving path. A high power transmitting waveguide filter and a receiving waveguide filter having a low insertion loss characteristic are combining to the antenna port via the magnetic plane T-junction.

Meanwhile, a conventional waveguide diplexer has been introduced in Korea patent publication No. 1995-0028216, issued to Keuk-Hwan Na, entitled "Waveguide diplexer of monolithic shunt stub structure removing tuning step" (hereinafter, a first conventional waveguide diplexer). The first conventional waveguide diplexer prevents transmitting power to interfere to a receiver by high isolation characteristic between a transmitter and the receiver. The first conventional waveguide diplexer uses Ku frequency band (uplink frequency: 14.5~14.8 GHz, downlink frequency: 11.7~12.0 GHz) and has a transmitting filter having a bandpass characteristic. For isolating a transmitting path and a receiving path, the first conventional waveguide diplexer has a T form of a magnetic plane junction. The conventional first waveguide diplexer has more than 25 dB of return loss in a passband of transmitting/receiving band, less than 0.1 dB of the insertion loss, and less than −70 dB of transmitting/receiving isolation characteristic. Also, the first conventional waveguide diplexer can handle maximum 1.5 kW electric power.

Meanwhile, another conventional waveguide diplexer using the T magnetic plane junction has been introduced in an article by Yong-Min Lee, entitled "A study of the Design and Fabrication of Diplexer Using H-plane T-junction for KOREASAT-III Transponder" in Korea Electromagnetic Engineering Society, Vol. 19, No. 4, pp 582-593. (Hereinafter second conventional waveguide diplexer) The second conventional waveguide diplexer uses Ka frequency band for easily obtaining frequency resources and increasing a signal transmission speed. Also, the second conventional waveguide diplexer has a transmitting filter having the bandpass characteristic and includes the magnetic plane T-junction. The second conventional waveguide diplexer has more than 13 dB of return loss, less than 1.2 dB of insertion loss and less than −65 dB of transmitting/receiving isolation characteristic.

As a reference, a waveguide diplexer of the present invention uses a Ka frequency band (uplink frequency: 29.6~30.0 GHz, downlink frequency: 19.8~20.2 GHz). A transmitting filter of the waveguide diplexer of the present invention has a low pass characteristic and a receiving filter of the present invention has a bandpass characteristic. Also, the waveguide diplexer of the present invention includes the electric plane T-junction for minimizing frequency interference. The waveguide diplexer of the present invention has more than 25 dB of return loss, less than 0.1 dB of insertion loss and less than −70 dB. Also, it can be operated at maximum 26.3 Kw electric power.

Comparing the waveguide diplexer of the present invention to the first and the second conventional waveguide diplexers, the waveguide diplexer of the present invention has better return loss, insertion loss and transmitting/receiving isolation characteristics. Also, the waveguide diplexer of the present invention has a higher electric power capability.

SUMMARY OF THE INVENTION

It is, therefore, an object of the present invention to provide a waveguide diplexer having an electric plane T-junction structure with a resonant iris for transferring a signal in high electric power through a transmitting path, transferring a signal with low insertion loss through a receiving path, and preventing a transmitting power to interfere to a receiver by connecting a transmitting filter and a receiving filter with an electric plane T-junction providing good isolation characteristics between a transmitter and a receiver.

In accordance with one aspect of the present invention, there is provided a waveguide diplexer, including: a waveguide having a predetermined shaped cross section; a transmitting filter for preventing to generate a harmonic band and a higher mode in a receiving band by changing impedance to have a low pass characteristic inside the waveguide; a receiving filter for minimizing an insertion loss by changing impedance to have a bandpass characteristic inside the waveguide; an electric plane T-junction for isolating/combining a transmitting signal and a receiving signal without electric interference by connecting the transmitting filter and the receiving filter, and minimizing interference of a frequency transmitted/received through the transmitting filter and the receiving filter; and an impedance converter for differentiating a transmitting port and a receiving port with minimum electric interference to the transmitting filter and the receiving filter by changing the impedance.

The present invention is a waveguide diplexer for the Ka frequency band (uplink frequency: 29.6~30.0 GHz, downlink frequency: 19.8~20.2 GHz). The waveguide diplexer of the present invention includes a transmitting filter having a low pass characteristic, a receiving filter having a bandpass characteristic and an electric plane T-junction for minimizing a frequency interference.

The transmitting filter includes a plurality of corrugations and the receiving filter includes some irises. Also, the electric plane T-junction includes a matching element.

That is, the waveguide diplexer of the present invention uses the electric plane T-junction for separating signals and includes a low pass filter having nine resonators in the transmitting path for high electric power transmission. Also, a low insertion loss filter is implemented by using a bandpass filter having inductive iris structure for having 2-pol Chebyshev response characteristics in a receiving path.

According to the present invention, the waveguide diplexer has 25 dB of return loss, less than 0.1 dB of insertion loss, and less than −70 dB of isolation characteristics. Also, maximally, 26.3 Kw electric power can be used in the waveguide diplexer of the present invention. Furthermore, the performance of the electric plane T-junction is increased to 10 dB by using the matching element (resonant iris).

BRIEF DESCRIPTION OF THE DRAWINGS

The above and other objects and features of the present invention will become apparent from the following description of the preferred embodiments given in conjunction with the accompanying drawings, in which:

FIG. 7 is a graph showing comparison of electric characteristics of a T-junction with a matching element and without that;

DETAILED DESCRIPTION OF THE PREFERRED EMBODIMENTS

Reference will now be made in detail to the preferred embodiments of the present invention, examples of which are illustrated in the accompanying drawings.

Hereinafter, a fundamental principle of the present invention is explained.

In case of using a dominant mode of a rectangular waveguide, electric current is minimized at a center of broad wall of the rectangular waveguide. Therefore, a degradation of performance may be minimized when the center of broad wall is cut comparing other cross sections. Accordingly, a T-junction is better to be the electric plane structure than a magnetic plane structure for providing superior electric characteristic.

Also, a transmitting diplexer for a satellite must be designed for having sufficient multipaction margin in order to prevent a breakdown and be operated in a high electric power. A receiving diplexer must to be designed for minimizing loss in a passband for improving a noise characteristic of the satellite system.

Also, using Ka frequency band (uplink frequency: 29.6-30.0 GHz, downlink frequency: 19.8~20.2 GHz) is better for easily obtaining frequency resource and increasing a signal transmission speed comparing to using Ku frequency band (uplink frequency: 14.5~14.8 GHz, downlink frequency: 11.7~12.0 GHz).

Figure 1:
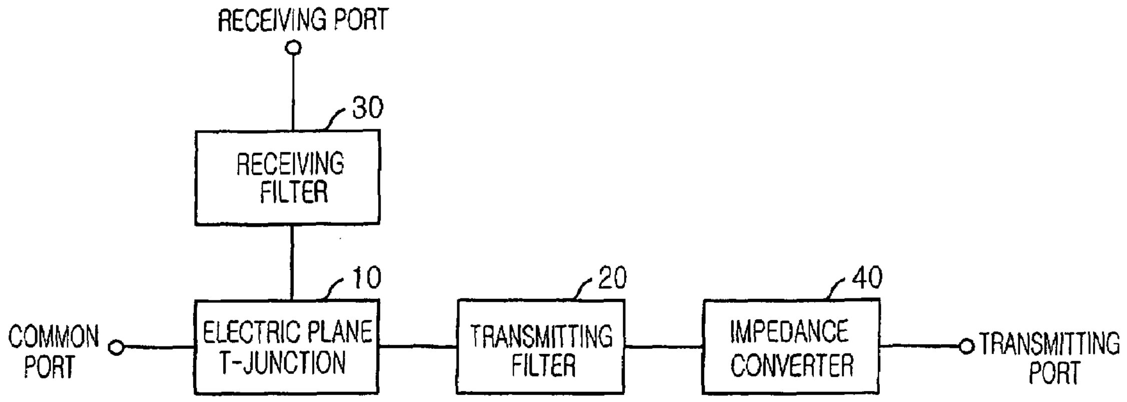
FIG. 1 is a block diagram illustrating a waveguide diplexer having an electric plane T-junction structure with resonant iris in accordance with a preferred embodiment of the present invention.

FIG. 1 is a block diagram illustrating a waveguide diplexer having an electric plane T-junction structure with resonant iris in accordance with a preferred embodiment of the present invention.

As shown in FIG. 1, the waveguide diplexer includes a waveguide having a predetermined shape of a cross section. Also, the waveguide diplexer includes an electric plane T-junction 10, a transmitting filter 20, a receiving filter 30 and an impedance converter 40 inside the waveguide. The transmitting filter 20 prevents to generate a harmonic band and a higher mode in a receiving band by changing impedance inside the waveguide to have a low pass characteristic. The receiving filter 30 minimizes an insertion loss by changing impedance inside the waveguide to have the bandpass characteristic. The electric plane T-junction 10 connects the transmitting filter and the receiving filter, separates/combines a transmitting signal and a receiving signal without electric influence, and minimizes interference of a frequency transmitting between the transmitting filter and the receiving filter. The impedance converter 40 changes the impedance in order to minimize the electric influence to the transmitting filter and the receiving filter and differentiates a transmitting port and a receiving port.

Figure 2:
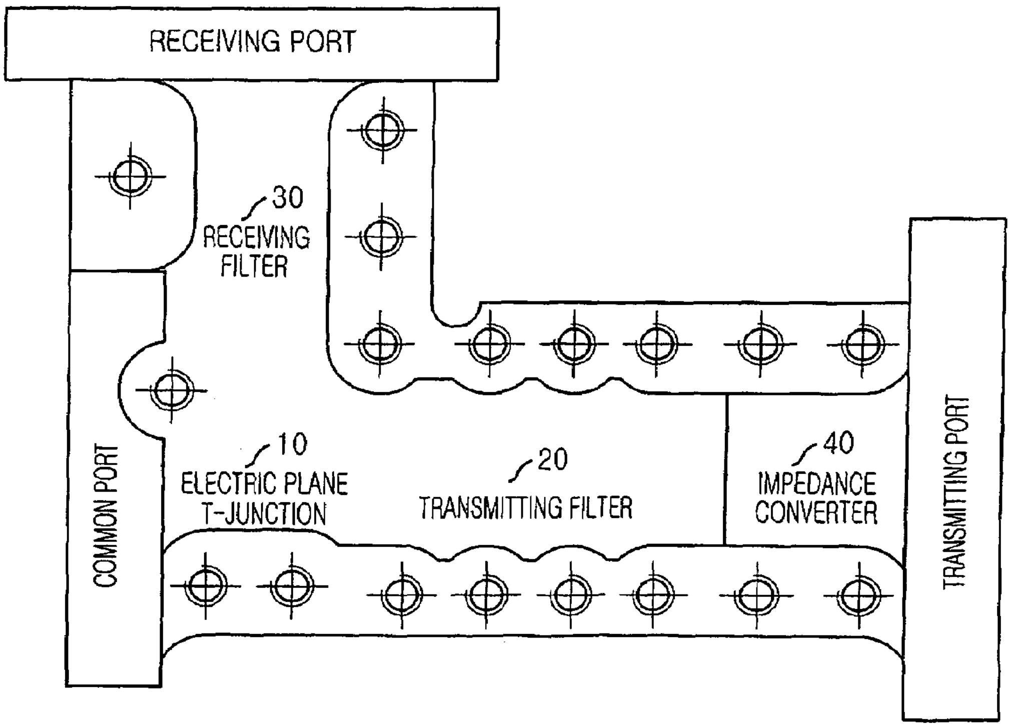
FIG. 2 is a view showing an external shape of a waveguide diplexer in accordance with a preferred embodiment of the present invention.

FIG. 2 is a view showing an external shape of a waveguide diplexer in accordance with a preferred embodiment of the present invention.

As shown in FIG. 2, the waveguide diplexer is manufactured by splitting down the electric plane for providing better electric performance and joining two parts by using screws.

The waveguide diplexer includes three ports including a common port, a transmitting port and a receiving port. Different types of waveguides are used for the transmitting port and the receiving port. That is, a WR-51 waveguide is used for the transmitting port and a WR-34 waveguide is used for the receiving port.

Figure 3:
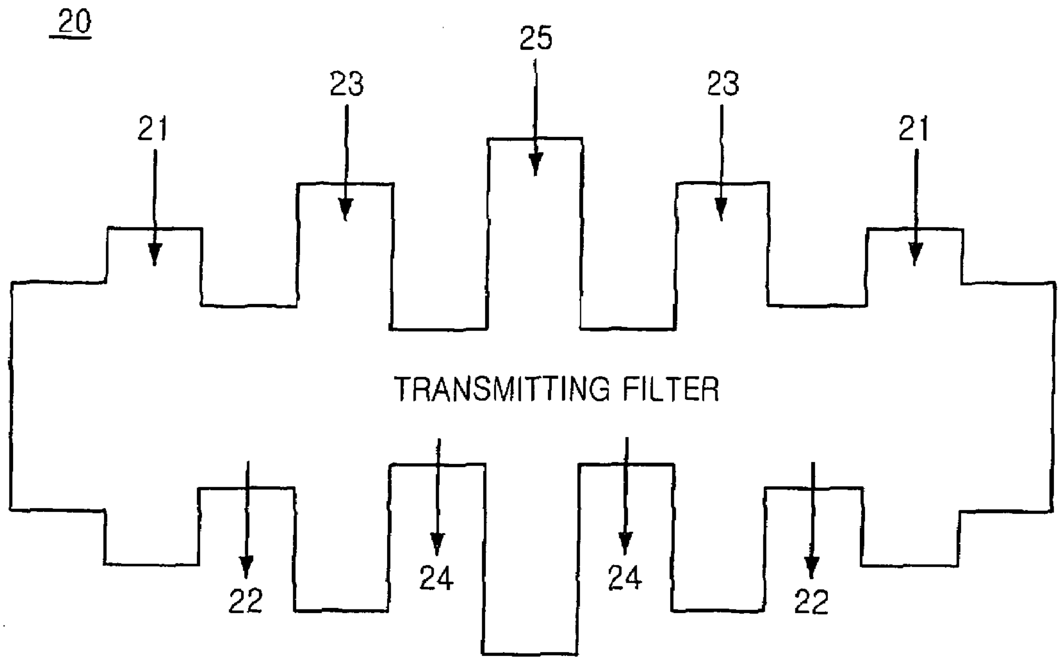
FIG. 3 is a cross-section view of a transmitting filter in a waveguide diplexer in accordance with a preferred embodiment of the present invention.

FIG. 3 is a cross-section view of a transmitting filter in a waveguide diplexer in accordance with a preferred embodiment of the present invention.

As shown in FIG. 3, the transmitting filter 20 is a low pass filter including nine corrugations 21 to 25 operated in 19.8 to 20.2 GHz. By including the nine corrugations 21 to 25, the transmitting filter 20 alternatively uses a waveguide unit having high impedance characteristic and a waveguide unit having low impedance characteristic. It is called as step impedance. The shown form of the transmitting filter 20 is easy to design and occupies comparative small area comparing to a low pass filter using a stub. Accordingly, the transmitting filter 20 controls impedance to be higher or to be lower by using the nine corrugations 21 to 25 for providing the low pass characteristics and thus the transmitting filter 20 prevents to generate the harmonic band and higher mode.

Since high power is passed through the transmitting filter 20, a waveguide gap must be designed considering high power. That is, the nine corrugations 21 to 25 are arranged for high power and the corrugation 24 has a gap of 2.82 mm and it can endure maximum 26.3 kw of electric power.

Meanwhile, the receiving filter 30 is designed for having superior insertion loss and easy manufacture. Since a frequency is high as 30 GHz, the number of order is reduced for minimizing the insertion loss.

Figure 4:
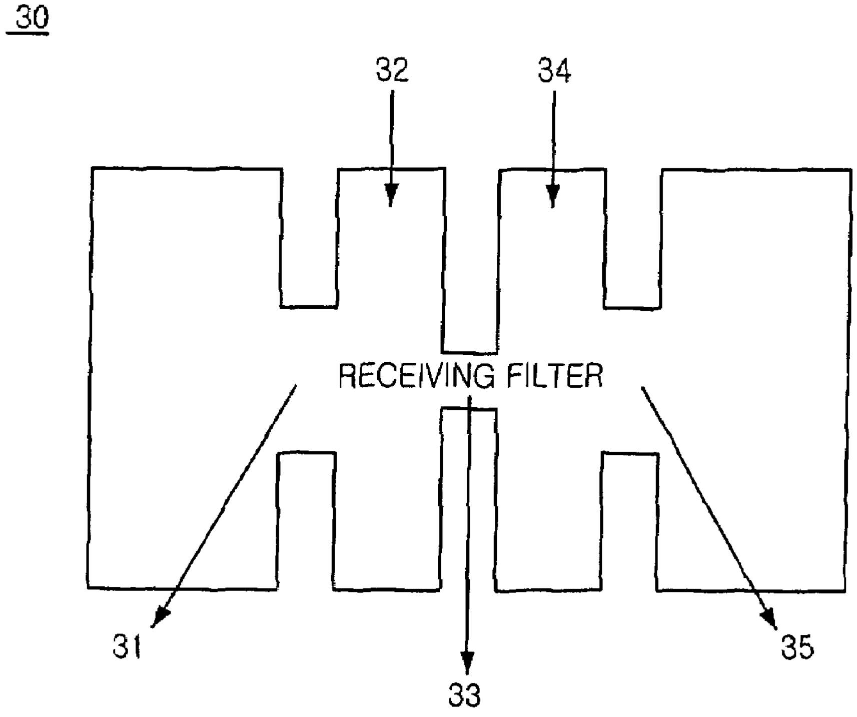
FIG. 4 is a cross-section view of a receiving filter in a waveguide diplexer in accordance with a preferred embodiment of the present invention.

FIG. 4 is a cross-section view illustrating a receiving filter in a waveguide diplexer in accordance with a preferred embodiment of the present invention.

As shown, the receiving filter 30 includes inductive irises 31, 33, 35 and resonators 32, 34. Modes of the resonators 32, 34 are $TE_{101}$ modes. A response characteristic of the receiving filter is 2-pol Chebyshev type.

That is, the receiving filter 30 is a bandpass filter having inductive iris structure of 2-pol Chebyshev response, which is operated in 29.6~30.0 GHz. It is not sensitive for low loss and temperature change. For designing a passband filter, a Chebyshev bandpass filter is designed according to an order and ripple at first and a lumped element is converted to a transmission line unit by Richard transformation and Kuroda identities. And then, impedance of a circuit and frequencies are scaled.

Figure 6:
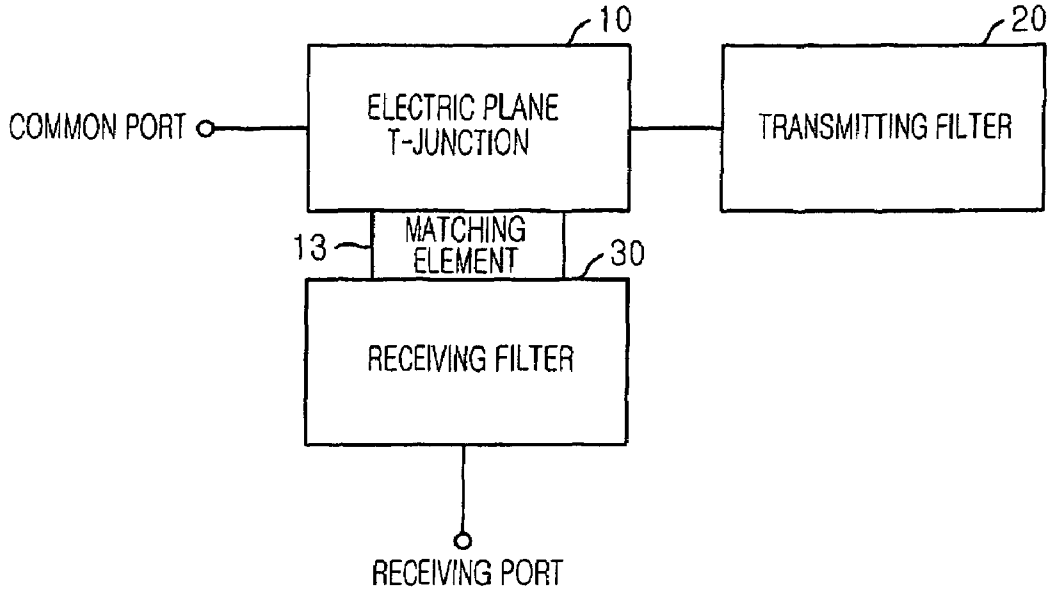
FIG. 6 is a diagram illustrating a waveguide diplexer having an electric plane T-junction with a matching element for minimizing interference between transmitting/receiving paths.

The electric plane T-junction 10 is used for isolating and combining signals without electrically interfering to transmitting filter 20 and the receiving filter 30. And, for minimizing interference to the transmitting filter 20 and the receiving filter 30, a resonant iris (matching element 13) having an appropriate size is inserted in a direction of the receiving filter 30 as shown in FIG. 6.

Figure 5A:
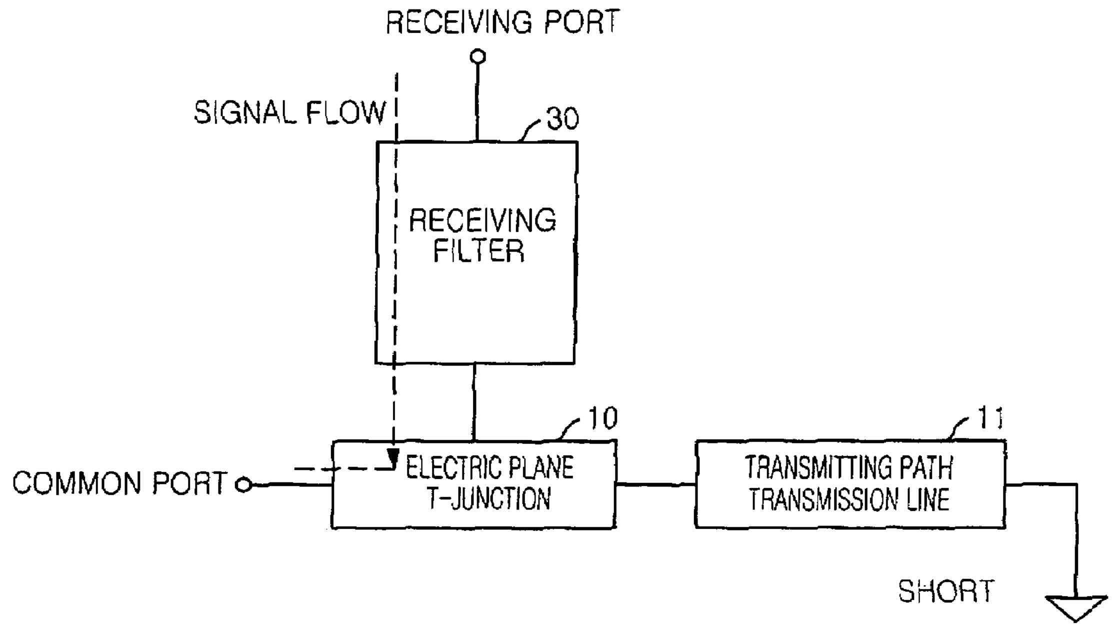
FIGS. 5A and 5B are diagrams of a waveguide diplexer with transmission lines for explaining characteristics of an electric plane T-junction.
Figure 5B:
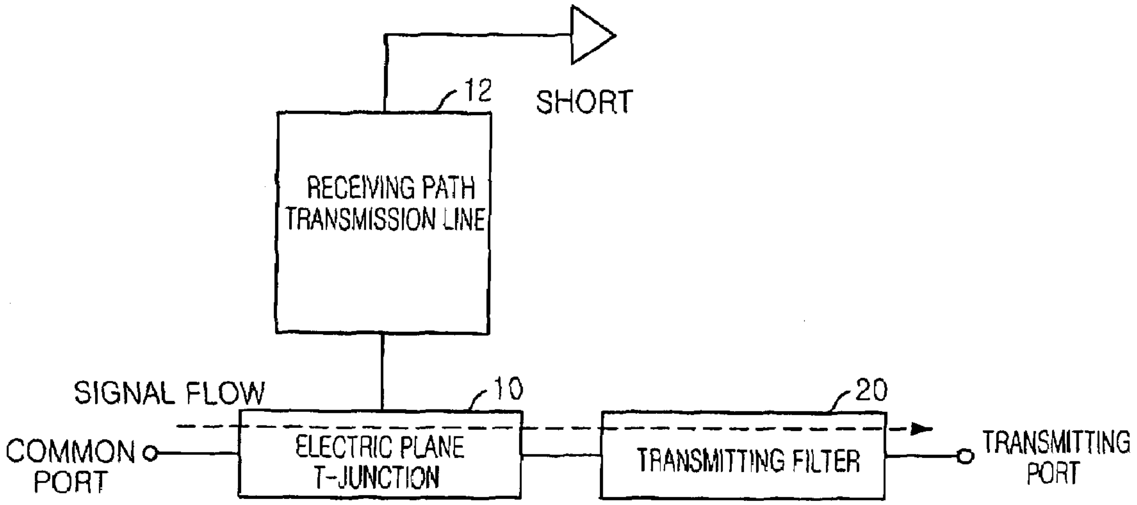

FIGS. 5A and 5B are diagrams illustrating waveguide diplexers with transmission lines for explaining characteristics of an electric plane T-junction.

As shown in FIGS. 5A and 5B, short circuits (transmitting path transmission line (Tx ARM) 11, receiving path transmission line (Rx ARM) 12) are formed at locations of the transmitting filter and the receiving filter.

For obtaining characteristics between the common port and the receiving port, the short circuit having a predetermined length of the Tx ARM 11 is formed at the transmitting port as shown in FIG. 5A. The predetermined length of the Tx ARM 11 is controlled for providing a superior return coefficient characteristic between the common port and the receiving port in a receiving frequency band.

In contrary, for obtaining characteristics between the common port and the transmitting port, the short circuit having a predetermined length of the Rx ARM 12 is formed at the receiving port as shown in FIG. 5B. The predetermined length of the Rx ARM 12 is controlled for providing a superior reflection coefficient characteristic between the common port and the transmitting port in transmitting frequency band.

Generally, a performance of the electric plane T-junction 10 is dynamically changed when the electric plane T-junction 10 is directly connected to the transmitting filter 20 or the receiving filter 30. For stabilizing the performance, the resonant iris 13 which is the matching element may be used at the receiving filter 30 as shown in FIG. 6.

Figure 7:
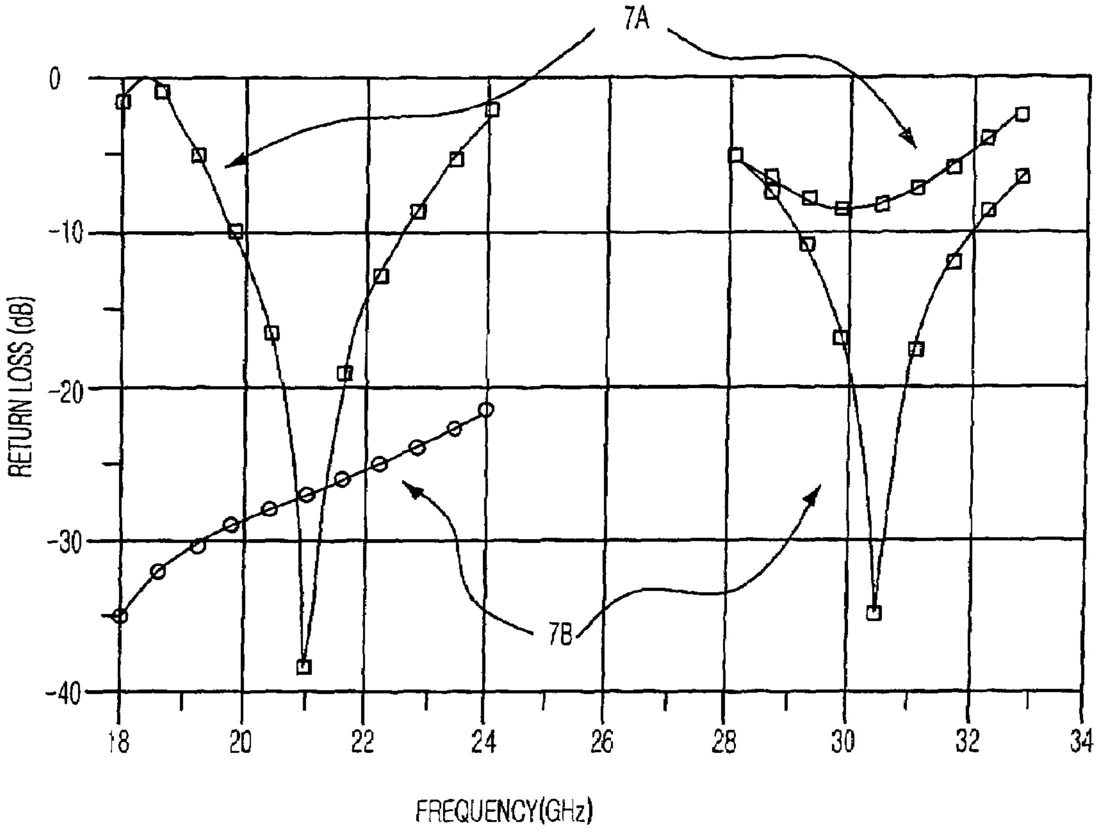

FIG. 7 is a graph showing comparison of electric characteristics of a T-junction with a matching element and without that.

As shown in FIG. 7, a curve 7*a* shows a return loss in case that there is no the resonant iris 13 and a curve 7*b* shows a return loss in case that there is the resonant iris 13. As shown, when the resonant iris 13 is not, the turn loss is around 10 dB. However, when the resonant iris 13 is to the receiving filter, the return loss is improved to 20 dB.

Figure 8:
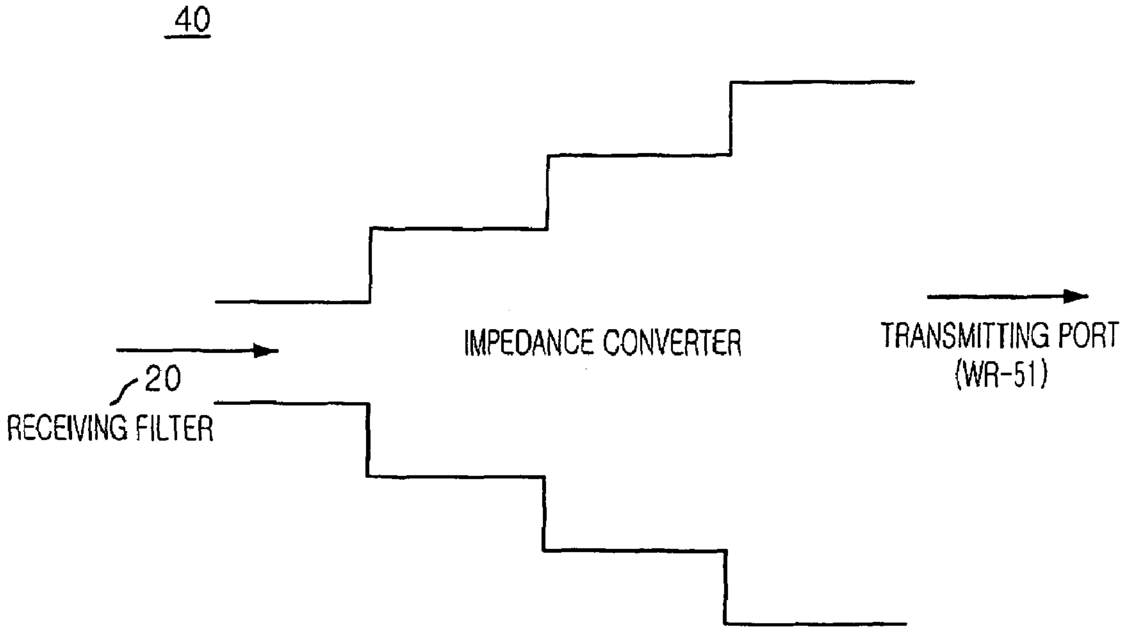
FIG. 8 is a cross-sectional view of an impedance converter in a waveguide diplexer in accordance with a preferred embodiment of the present invention.

FIG. 8 is a cross-sectional view of an impedance converter in a waveguide diplexer in accordance with a preferred embodiment of the present invention.

The impedance converter 40 is a device for implementing the transmitting port by using the WR-51 waveguide. As shown in FIG. 8, the impedance converter 40 has a step structure for gradually changing impendence in order to minimize electric interference to the transmitting filter 20 and the receiving filter 30. That is, the impedance converter 40 has a symmetric two-step impendence converter structure for minimizing a physical length in order to prevent interfering to electric performance of the optimized waveguide diplexer.

Figure 9A:
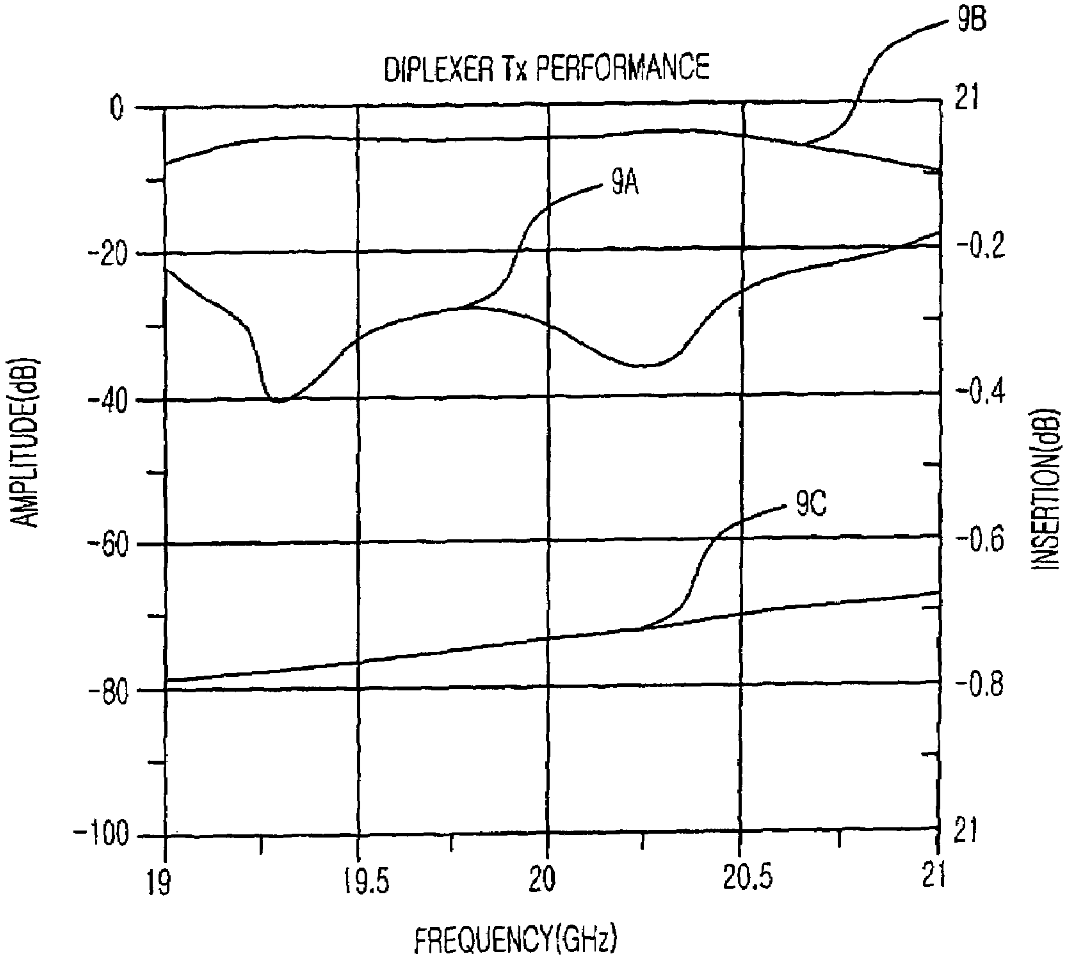
FIGS. 9A and 9B are graphs showing electric characteristics of a waveguide diplexer having an electric plane T-junction structure with resonant iris in accordance with a preferred embodiment of the present invention.
Figure 9B:
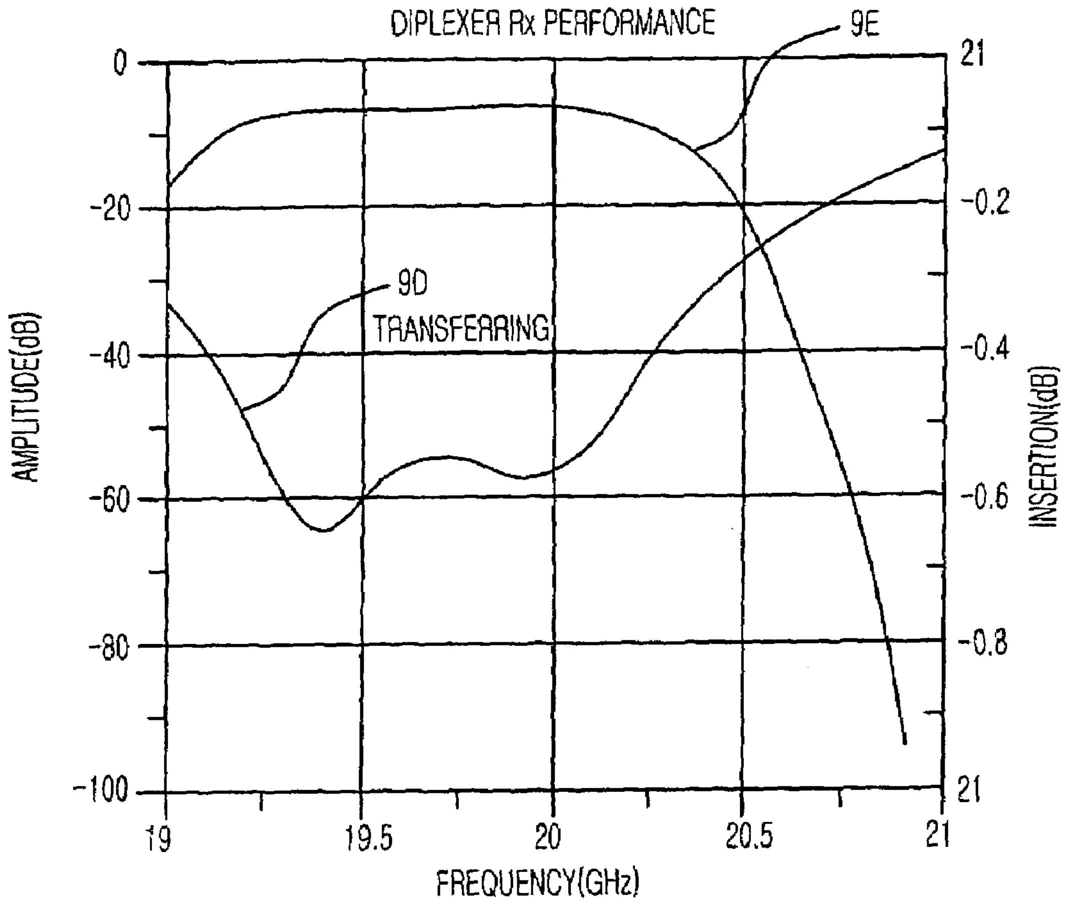

FIGS. 9A and 9B are graphs showing electric characteristics of a waveguide diplexer having an electric plane T-junction structure with resonant iris in accordance with a preferred embodiment of the present invention.

In FIGS. 9A and 9B, curves 9*a* and 9*d* show a return loss characteristics, curves 9*b* and 9*e* show an insertion loss characteristics, and curve 9*c* shows an isolation characteristics.

As shown in FIGS. 9A and 9B, the waveguide diplexer of the present invention has more than 25 dB of a transmitting return loss 9*a* and a receiving return loss 9*d*, less than 0.1 dB of a transmitting insertion loss 9*b* and a receiving insertion loss 9*e*, and less than −70 dB of transmitting/receiving isolation characteristics 9*c*.

The waveguide diplexer having the above-mentioned characteristics uses a Ka frequency band (uplink frequency: 29.6~30.0 GHz, downlink frequency: 19.8~20.2 GHz) for easily obtaining frequency resource and increasing a signal transmission speed comparing to a Ku frequency band (uplink frequency: 14.5~14.8 GHz, downlink frequency: 11.7~12.0 GHz).

As described above, the waveguide diplexer of the present invention can transmit maximum 26.3 kw electric power through the transmitting path since the waveguide diplexer of the present invention includes the minimum gap 24 admitting maximum 26.3 kw.

Also, the performance of the electric plane T-junction 10 is increased to 10 dB by using the resonant iris 13 comparing an electric plane T junction without the resonant iris 13.

As mentioned above, the waveguide diplexer of the present invention has 25 dB of return loss, less than 0.1 dB of insertion loss, and less than −70 dB of isolation characteristics. Also, maximally, 26.3 Kw electric power can be used in the waveguide diplexer of the present invention. Furthermore, the performance of the electric plane T-junction is increased to 10 dB by using the matching element (resonant iris).

That is, in the present invention, the transmitting filter is designed to have low pass characteristics for transmitting and handling high electric power, and preventing to generate higher mode and harmonic band. Also, the receiving filter is designed by inductive irises and resonators for having Chebyshev response characteristics and for minimizing insertion loss.

Furthermore, the electric plane T-junction connects the transmitting filter and the receiving filter, and minimizes electric interference to the transmitting and the receiving filters by using the matching element.

Moreover, the impedance converter is included for using the WR-51 waveguide as the transmitting port and does not electrically interfere to the transmitting and the receiving filters. Also, the impedance converter has the symmetric two-step structure for minimizing the physical length.

As mentioned above, the diplexer interfaces the WR-51 waveguide as the transmitting port and the WR-34 as the receiving port. Also, the diplexer having the above mentioned structure has −70 dB of transmitting/receiving isolation characteristics and 0.1 dB of insertion loss of receiving path. Also, maximally, 26.3 Kw electric power can be transmitted through the transmitting path.

The present application contains subject matter related to Korean patent application No. 2004-61243, filed in the Korean Intellectual Property Office on Aug. 3, 2004, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A waveguide diplexer, comprising:

a waveguide having a predetermined shaped cross section;

a transmitting filter, one end of which coupled to an output port of the waveguide and the other end coupled to an electric plane T-junction, for preventing to generate a harmonic band and a higher mode in a receiving band by changing impedance to have a low pass characteristic inside the waveguide;

a receiving filter, one end of which coupled to an input port of the waveguide and the other end coupled to the electric plane T-junction, for minimizing an insertion loss by changing impedance to have a bandpass characteristic inside the waveguide;

the electric plane T-junction, one end of which coupled to an input/output port of the waveguide, for isolating/combining the transmitting signal and the receiving signal without electric interference by connecting the transmitting filter and the receiving filter, and minimizing interference of a frequency transmitted/received through the transmitting filter and the receiving filter; and an impedance converter for differentiating the output port and the input port with minimum electric interference to the transmitting filter and the receiving filter by changing the impedance, wherein the transmitting filter includes a plurality of corrugations having different impedances for having a low pass characteristic by alternatively controlling the impedance to be higher or to be lower in order to prevent generating a higher mode and a harmonic band, wherein the minimum gap among a plurality of the corrugations handles maximum electric power.

2. The waveguide diplexer as recited in claim 1, wherein the electric plane T-junction has a T form of electric plane structure.

3. The waveguide diplexer as recited in claim 1, wherein the receiving filter includes inductive irises and resonators for having Chebyshev response and has a bandpass characteristic.

4. The waveguide diplexer as recited in claim 3, wherein the electric plane T-junction is a T form of electric plane structure for matching by inserting a matching element in a direction of the receiving filter.

5. The waveguide diplexer as recited in claim 4, wherein the matching element is designed for minimizing electric interference to the transmitting filter and the receiving filter.

6. The waveguide diplexer as recited in claim 1, wherein the impedance converter is a two-step impedance converter having a symmetric step structure for minimizing a physical length and preventing to interfere to an electrical characteristic of the waveguide filter.

7. The waveguide diplexer as recited in claim 6, wherein the waveguide diplexer is an equipment for the Ka band satellite (uplink frequency: 29.6~30.0 GHz, downlink frequency: 19.8~20.2 GHz) for easily obtaining a frequency resource and increasing a signal transmission speed.

* * * * *